United States Patent [19]

Horioka et al.

[11] Patent Number: 5,258,332
[45] Date of Patent: Nov. 2, 1993

[54] METHOD OF MANUFACTURING SEMICONDUCTOR DEVICES INCLUDING ROUNDING OF CORNER PORTIONS BY ETCHING

[75] Inventors: Keiji Horioka, Kanagawa; Haruo Okano, Tokyo; Hirotaka Nishino, Kanagawa, all of Japan

[73] Assignee: Kabushiki Kaisha Toshiba, Kanagawa, Japan

[21] Appl. No.: 29,307

[22] Filed: Mar. 8, 1993

Related U.S. Application Data

[63] Continuation of Ser. No. 829,549, Feb. 4, 1992, abandoned, which is a continuation of Ser. No. 671,189, Mar. 18, 1991, abandoned, which is a continuation of Ser. No. 414,745, Sep. 27, 1989, abandoned, which is a continuation of Ser. No. 234,347, Aug. 19, 1988, abandoned.

[30] Foreign Application Priority Data

Aug. 28, 1987 [JP] Japan ................. 62-213083

[51] Int. Cl.5 ................................. H01L 21/311
[52] U.S. Cl. ................................. 437/228; 437/919; 437/52; 437/67; 156/644
[58] Field of Search ............... 437/52, 228, 919; 156/643, 644

[56] References Cited

U.S. PATENT DOCUMENTS

| | | | |
|---|---|---|---|
| 4,475,982 | 10/1984 | Lai et al. ......................... | 156/643 |
| 4,645,564 | 2/1987 | Morie et al. ..................... | 156/643 |
| 4,693,781 | 9/1987 | Leung et al. .................... | 156/643 |
| 4,717,448 | 1/1988 | Cox et al. ....................... | 156/643 |
| 4,718,973 | 1/1988 | Abraham et al. ................ | 156/628 |
| 4,729,815 | 3/1988 | Leung ............................. | 156/643 |
| 4,735,824 | 4/1988 | Yamabe et al. ................. | 427/79 |
| 4,857,477 | 8/1989 | Kanamorie ...................... | 437/47 |

FOREIGN PATENT DOCUMENTS 53-14472 5/1978 Japan.
59-23522 2/1984 Japan.
59-141232 8/1984 Japan.

OTHER PUBLICATIONS

Bassous, "Low Temperature Methods for Rounding Silicon Nozzles", IBM Tech. Disc. Bull., vol. 20, No. 2 (Jul. 1977), pp. 810–811.

Primary Examiner—George Fourson
Attorney, Agent, or Firm—Finnegan, Henderson, Farabow, Garrett & Dunner

[57] ABSTRACT

A method for rounding the corners of trench formed on the silicon substrate with metal, metal silicide or polycrystalline silicon thin film or the step portions of lead layers is provided. The steps of rounding are performed by chemical dry etching using a gas mixture of fluorine and oxygen. The abundance ratio of oxygen is determined to be one or more with respect to the fluorine. This method contributes significantly to the prevention of leakage current and the enhancement of insulating effect in the case of forming trench capacitors or the like.

26 Claims, 10 Drawing Sheets

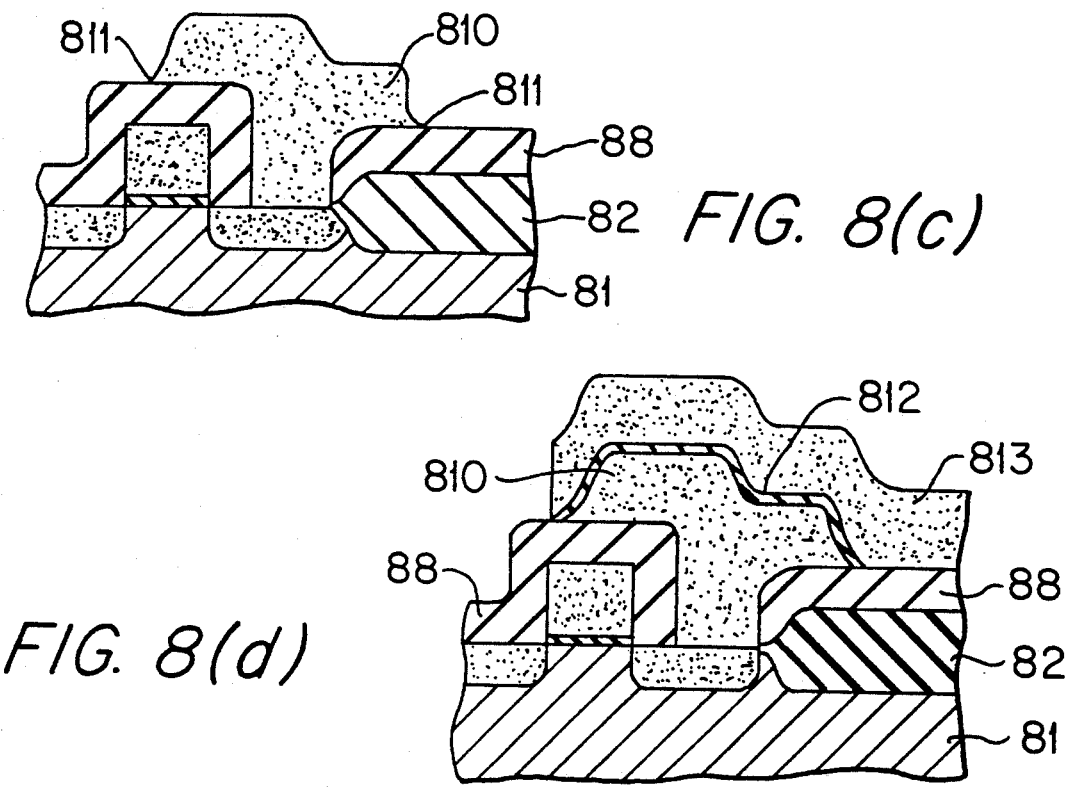
FIG. 8(c)
FIG. 8(d)
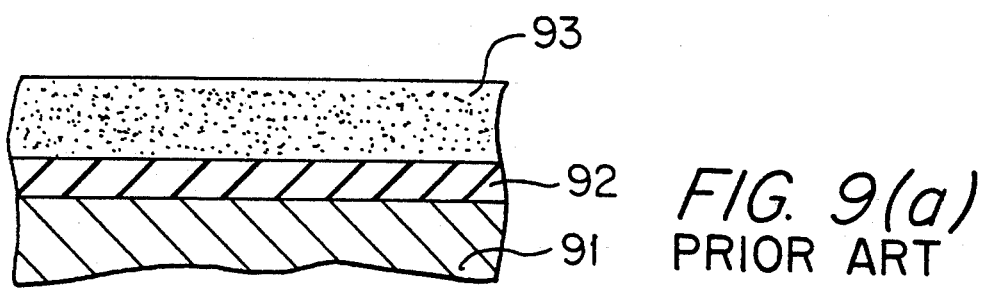
FIG. 9(a) PRIOR ART
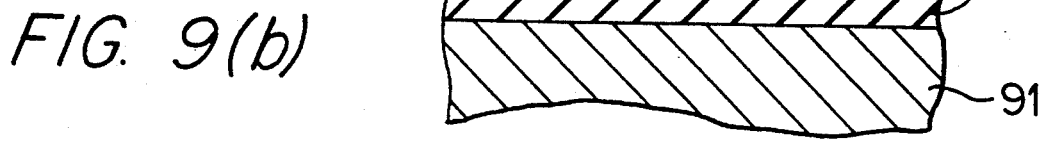
FIG. 9(b)

METHOD OF MANUFACTURING SEMICONDUCTOR DEVICES INCLUDING ROUNDING OF CORNER PORTIONS BY ETCHING

This is a continuation of application Ser. No. 07/829,549, field Feb. 4, 1992, now abandoned; which was a continuation of application Ser. No. 07/671,189, filed Mar. 18, 1991, now abandoned; which was a continuation of application Ser. No. 07/414,745, filed Sep. 27, 1989, now abandoned, which wa sa continuation of application Ser. No. 07/234,347, filed Aug. 19, 1988, now abandoned.

BACKGROUND OF THE INVENTION

1. Field of the Invention

This invention relates to a method of manufacturing semiconductor devices such as single crystal or polycrystalline silicon substrates having trenches and multilayer leads thereon, and more particularly to a method Of rounding the angular corner portions of trenches or the step portions of leads during etching.

2. Description of the Prior Art In recent years, semiconductor devices such as MOS dynamic random access memories (DRAM) have progressed in miniaturization and higher integration of elements in accordance with a scaling rule of reduction. The miniaturization of a MOS capacitor, which is one of the essential elements of a DRAM, has also progressed significantly. Here, it is assumed that the thickness and area of the gate oxide film of a MOS capacitor are $t_{ox}$ and S, respectively, and the scaling factor is $\alpha$. The thickness and area of the gate oxide film after reduction will be $t_{ox}/\alpha$ and $S/\alpha^2$, respectively. The capacitance of the MOS capacitor can be expressed by $C=\epsilon S/t_{ox}$, where $\epsilon$ represents a dielectric constant. Thus, the capacitance $C'$ after the reduction will be $C'=C/\alpha$. When the capacitance of MOS capacitor reduces to $1/\alpha$, data stored in the MOS DRAM are subjected to errors caused by undesirable penetrating rays, such as alpha rays. Moreover, when the capacitance of a MOS capacitor decreases, the ratio of this capacitance to the stray capacitance that inherently exists between the bit lines and the substrate becomes small. This reduces the accuracy in sensing data, and causes erroneous operations of the MOS DRAM. Therefore, the area of the gate oxide film, which is the area of the MOS capacitor, is generally not reduced to $S/\alpha^2$ However, from generation to generation, the further reduction of elements has been continuously required. Thus, it is increasingly difficult to obtain highly reliable semiconductor devices, such as DRAMs.

To increase the capacitance of the MOS capacitor, the use of an insulating film having a large dielectric constant (such as $Ta_2O_5$, for example) has been considered. However, more time is necessary until this film can be put into practical use. Meanwhile, the use of an extremely thin silicon oxide film of 10 nm or less having high reliability has also been considered. However, such a film requires pure water of high purity or chemicals, and also requires a clean room of very high cleanliness. Thus, this film is also very far from the stage of practical application.

Therefore, a so-called trench capacitor technique has been considered to increase the capacitance of the MOS capacitor. In this technique, a trench is formed on the surface of the semiconductor substrate so as to practically increase the area of the capacitor without an increase in the whole size of elements. However, when a trench having sidewalls perpendicular to the substrate is formed by anisotropic etching, such as reactive ion etching (RIE), the following problem arises. Specifically, the corners of upper and bottom portions of the trench have an extremely small radius of curvature. Thus, when the gate film is formed by thermal oxidation, the oxide films formed on the corners become thinner than the flat portion. This phenomenon can be explained as follows. In general, when silicon is oxidized to form an oxide film, the volume of the film to be formed is about 2.3 times that of the original silicon. Thus, when the oxidation progresses, compression stresses are applied on the oxide film side of the interface between the silicon and silicon oxide film, and stress concentrations occur therein. Consequently, the oxidation thereof is suppressed.

As described above, the oxide films at the corners of the bottom and upper portions of the trench become thinner than the flat portions. Thus, the dielectric breakdown voltage of these corner portions decreases. The thinned film also causes a large leakage current to flow even in a weak electric field. If the gate oxide film is made thicker, the leakage current in the operating voltage can be suppressed to a sufficiently small level. However, this causes the film of the flat portions in the trench to be excessively thicker. This thickness cancels the effect of the increase in the capacitance of MOS capacitor, which is obtained by trenching so as to increase the surface area of the substrate.

On the other hand, a so-called stacked capacitor technique has been considered. In this technique, the capacitance of the MOS capacitor can be increased within a limited space. Specifically, one electrode of polycrystalline silicon is stacked on the element or element isolation region, and the surface thereof is oxidized. Thereafter, another electrode is similarly formed on the stacked element, so as to constitute a MOS capacitor. However, also in the case of polycrystalline silicon electrodes, the treatment of RIE inevitably produces angular corners on such electrodes. If the polycrystalline silicon surface is oxidized leaving the angular corners as they are, the oxide films of corners inevitably become thinner. This is a phenomenon similar to the case of the single crystal silicon. As a result, the insulating effect of the corners also deteriorates.

As described above, when a trench or a step portion is formed on the semiconductor substrate, the radius of curvature Of the corners at the bottom or upper portions of the trench or step portions becomes significantly reduced. These angular corners have caused problems in manufacturing elements of MOS DRAMs or the like.

SUMMARY OF THE INVENTION

Accordingly, one object of this invention is to provide a method of forming semiconductor elements such as trench capacitors or stacked capacitors in MOS dynamic memories, or the like. The method comprises the step of rounding corners of the trench or step portion. Thus. a deterioration in the insulating effect of the corners can be avoided. Also, the generation of a leakage current can be suppressed. As a result, the reliability of such elements can be significantly enhanced.

Briefly in accordance with one aspect of this invention, there is provided a method of forming a trench and step portions on a single-crystal or polycrystalline silicon substrate or on a thin film of metal or metal silicide.

The method comprises the step of rounding the corners of the trench and step portions by using a gas mixture including fluorine and oxygen. The abundance ratio of the oxygen is one or more with respect to the fluorine. Thus, the insulating effect of the corners can be maintained satisfactorily. As a result, the reliability of such elements can be significantly enhanced.

BRIEF DESCRIPTION OF THE DRAWINGS

A more complete appreciation of the invention and many of the attendant advantages thereof will be readily obtained as the same becomes better understood by reference to the following detailed description When considered in connection with the accompanying drawings, wherein:

FIGS. 8a through 8d are cross-sectional views illustrating a substrate in the steps of manufacturing a stacked MOS capacitor according to another embodiment of the present invention;

FIGS. 9a through 9d are cross-sectional views illustrating a substrate in the conventional steps of manufacturing multi-layer leads.

DESCRIPTION OF THE PREFERRED EMBODIMENTS

The main point of the present invention is that the angular corners of the trench and step portions formed on the substrate, which are inevitably produced by etching, can be significantly rounded. This can be achieved by exposing such angular corners of the substrate to an environment that includes fluorine and oxygen. The fluorine is activated by electric discharge so as to produce fluorine radicals. The abundance ratio of the oxygen is one or more with respect to the fluorine. This exposure forms silicon oxy-fluoride films on the surface of the trench and step portions while thinly etching the surface thereof.

Specifically, such forming and etching of the silicon oxy-fluoride film on the surface of the trench and step portions compete with each other under the condition in which the number of atoms of oxygen is greater than that of fluorine. This condition is specified so that even when the respective elements are in different states, such as molecule, ion or radical. Thus, the speed of etching can be regulated by the amount of the fluorine radicals supplied by diffusion within the silicon oxy-fluoride. Thus, projecting portions, which receive the larger amount of fluorine radicals because of their greater solid angles, are etched faster than the flat portions. Conversely, concave portions are etched slower than the flat portions. As a result, the corner portions of the trench are significantly rounded.

On the thus rounded corners and the flat portions of the trench on the silicon substrate or polycrystalline silicon film, a thin insulating film such as a gate oxide film is formed so as to constitute a MOS capacitor. In this case, the thickness of the insulating film becomes extensively uniform. Thus, the concentration of electric fields, which have conventionally been present at the corners in the trench, are reduced. As a result, the insulating effect of the insulating film can be significantly enhanced.

At the same time, the surface of the silicon substrate or polycrystalline silicon film is smoothened. Thus, the surface state density thereof is reduced. As a result, a p-n junction having a small inverse-leakage current is formed on the sidewalls of the trench. Consequently, element isolation ca be readily achieved.

Further, leads made of such materials as polycrystalline silicon, molybdenum silicide or tungsten can be processed to a tapered shape. Thus, elements of multilayer lead configuration can be readily manufactured.

Figure 1:
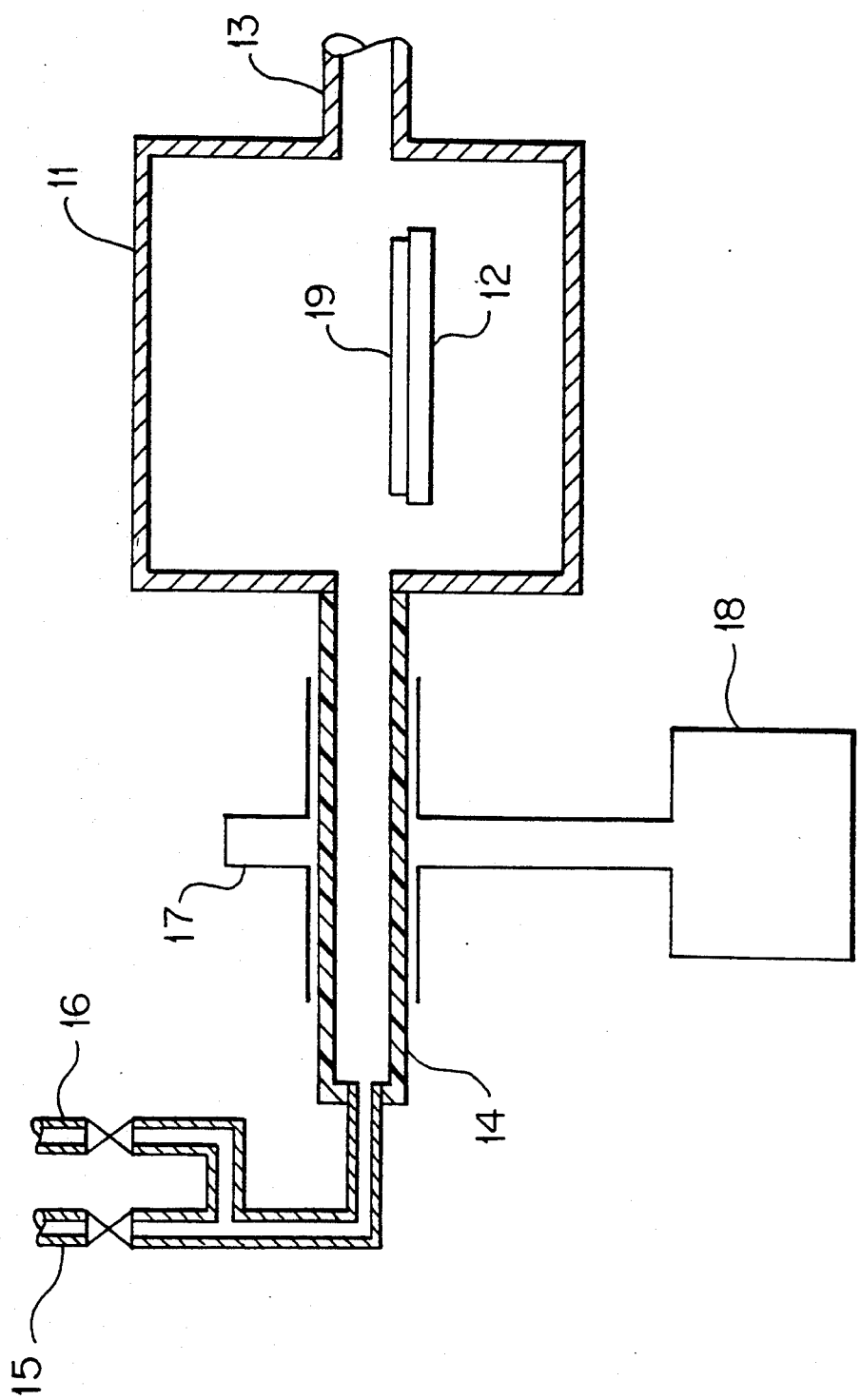
FIG. 1 is a schematic diagram illustrating a chemical dry etching (CDE) apparatus used for embodiments according to the present invention.

Here, prior to describing embodiments according to the present invention, a down-flow type etching apparatus (hereinafter referred to as a CDE, chemical dry etching apparatus) will be described. FIG. 1 is a schematic diagram illustrating a CDE apparatus. In FIG. 1, a reaction container 11 is provided with a workpiece holder 12 on which a workpiece is disposed. Gas-introducing pipes 15 and 16 that introduce gases of two kinds are connected to the reaction container 11 through an electric discharge tube 14 made of quartz. The electric discharge tube 14 causes the introduced gases to discharge. The gas-introducing pipes 15 and 16 introduce a $CF_4$ gas including fluorine element and oxygen, respectively. These gases are respectively controlled so as to maintain the specified flow-rates. At the same time, the gases within the reaction container 11 are exhausted from an exhausting pipe 13. As a result, a predetermined pressure therein is maintained. A microwave of a frequency of 2.45 GHz generated by a microwave generator 18 is applied through a waveguide 17 to the electric discharge tube 14, which in turn, generates a non-electrode discharge therein. This electric discharge causes the $CF_4$ gas to dissociate so as to produce fluorine radicals. The produced fluorine radicals are transferred together with oxygen into the reaction container 11. This gas mixture chemically reacts with a workpiece of specified material so as to perform etching.

Figure 2:
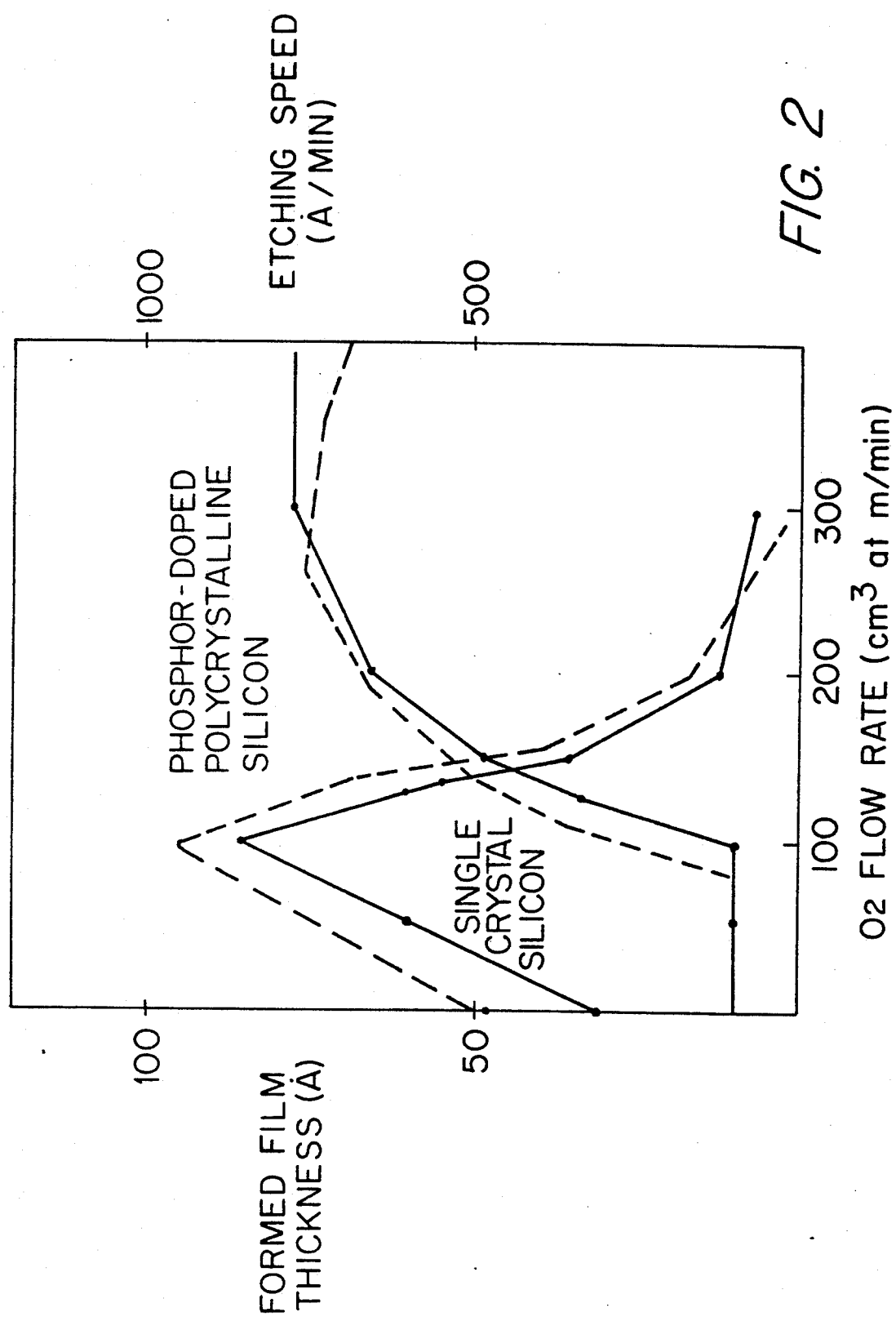
FIG. 2 is a graph illustrating the relationship between the etching speed of silicon and the thickness of silicon oxy-fluoride film, both with respect to the flow rate of oxygen, for explaining the operation according to the present invention.

Next, the reaction between silicon and the gas mixture of fluorine radicals and oxygen, which is the essential key to a method according to the present invention, will be described. FIG. 2 is a graph illustrating the relationship between the oxygen flow-rate and the silicon-etching speed in the case where the flow rate of CF₄ gas is determined as 50 atm·cm³/min. In FIG. 2, the solid line represents the case of single crystal silicon, and the dotted line represents the case of phosphor-doped polycrystalline silicon. In either case, when the oxygen is added, the silicon-etching speed is increased until the oxygen flow rate reaches about 100 atm·cm³/min. If the oxygen flow rate further increases, the silicon-etching speed decreases. This silicon-etching progresses in accordance with the following chemical reaction:

$$Si + 4F \rightarrow SiF_4 \uparrow$$

Further, the oxygen reacts with carbon containing radicals such as CF₃ and CF₂ produced by the dissociation of CF₄ so as to eliminate these radicals. This prevents the occurrence of recombination of the carbon containing radicals such as CF₃ and CF₂ with the fluorine atoms. As a result, the silicon-etching speed increases. Namely, when oxygen of a flow rate more than 100 atm·cm³/min is added to CF₄ of 50 atm/·cm³/min, the silicon-etching speed decreases. In order to clarify this cause, the silicon surface was measured by the Auger electron spectroscopy. This measurement revealed that a silicon oxy-fluoride film of 20 to 80 Å thick was formed on the silicon surface. In the graph of FIG. 2, besides the silicon-etching speed, the thickness of this silicon oxy-fluoride film is shown. Specifically, in the presence of fluorine atoms, the following reaction occurs and silicon reacts also with oxygen:

$$\overset{F}{Si + O_2 \rightarrow SiF_x \cdot O_y}$$

As a result of this, a nonvolatile silicon oxy-fluoride film is deposited on the silicon surface.

To increase the silicon-etching speed under these conditions, the fluorine atoms are required to diffuse within the silicon oxy-fluoride film and react with silicon. Further, the formed SiF₄ is required to inversely diffuse the silicon oxy-fluoride film and to dissolve therefrom. Thus, at the top corner portions of the trench or steps formed on the silicon substrate or on the polycrystalline silicon film, the silicon-etching speed increases because the solid angles thereof are sufficiently large to receive the supply of the fluorine atoms. As a result, the corner portions thereof are rounded. To the contrary, the silicon-etching speed of the concave portions is smaller. Thus, as a whole, the uneven surface is smoothened.

Referring now to the drawings, wherein like reference numerals designate identical or corresponding parts throughout the several views, and more particularly to FIGS. 3a through 3c thereof, one embodiment of this invention will be described.

Figure 3A:
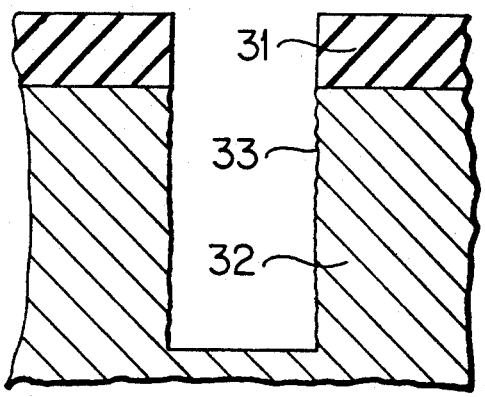
FIGS. 3a through 3c are cross-sectional views illustrating a substrate in the steps using the CDE apparatus of FIG. 1, according to one embodiment of the present invention.
Figure 3B:
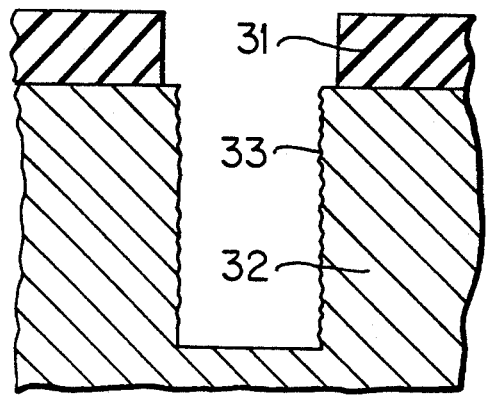
Figure 3C:
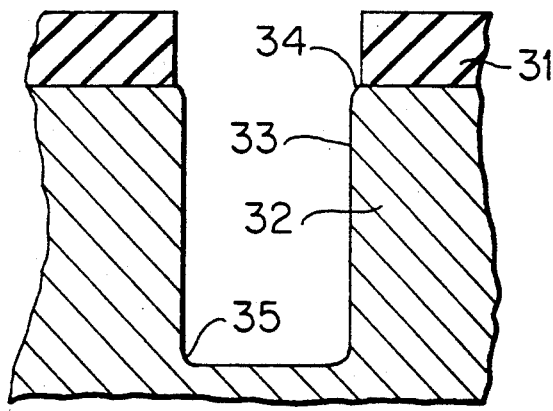

FIGS. 3a through 3c are cross-sectional views illustrating the steps of rounding corners of the trench formed by RIE (reactive ion etching). These steps of rounding were carried out by use of the CDE apparatus 0f FIG. 1. In FIG. 3a, a SiO₂ film 31 was formed as a mask on a silicon substrate 32. Further, a trench 33 was formed on the substrate 32 by RIE. The thus formed substrate 32 with the trench 33 was immersed in a buffer solution of a mixture of hydrogen fluoride and ammonium fluoride. As a result, the SiO₂ film 31 in the periphery of the opening of the trench 33 was eliminated as shown in FIG. 3b. Thereafter, the substrate 32 was disposed within the reaction container 11˙ of the CDE apparatus of FIG. 1, and treated by etching as follows. The etching conditions were such that CF₄ of a flow rate of 50 atm·cm³/min and O₂ of a flow rate of 150 atm·cm³/min were used, and the treating time was one minute. The shape of the trench 33 after such treatment was confirmed as shown in FIG. 3c. Specifically, both the upper and lower corner portions 34 and 35 of the trench 33 were rounded having the radius of curvature on the order of about 500 Å. Further, as shown in FIG. 3b, there was small unevenness on the sidewalls of the trench 33. However, these sidewalls were also smoothened by this treatment.

These advantages of rounding were obtained only when the abundance ratio of oxygen with respect to fluorine was in the range as follows. Specifically, in the case of a single crystal silicon, such abundance ratio was one or more, while in the case of polycrystalline silicon, the ratio was 1.2 or more. When such ratios were less than the specified above, no advantages could be obtained.

Figure 4A:
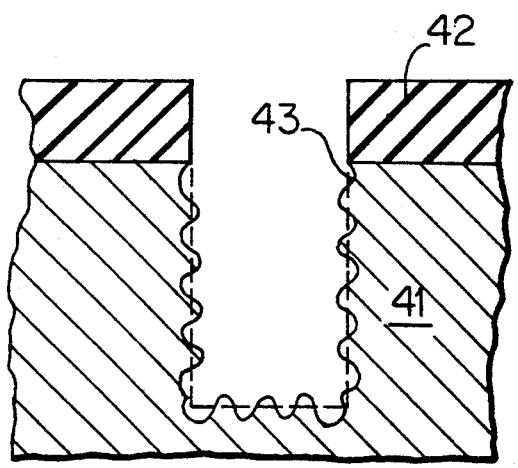
FIGS. 4a and 4b are cross-sectional views illustrating a substrate in the steps according to another embodiment of the present invention.

FIG. 4a is a cross-sectional view illustrating a substrate 41 having a SiO₂ film 42 formed thereon by use of the CDE apparatus of FIG. 1 immediately after that a trench 43 was formed by RIE. In this case, the corners of bottom portion of the trench 43 were rounded to a certain extent. However, the roughness of sidewalls of the trench 43 became more deteriorated than before treatment.

Figure 4B:
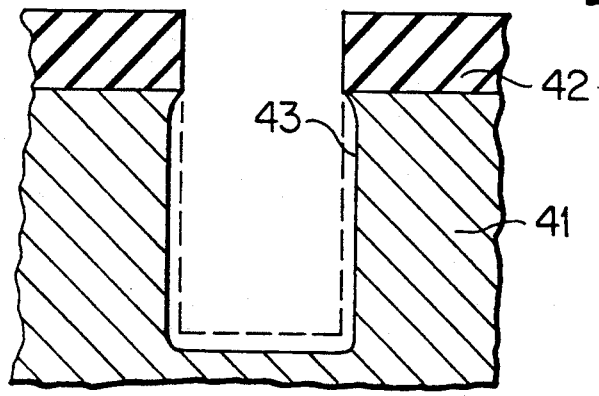

FIG. 4b is a cross-sectional view illustrating a substrate 41 having a trench 43 formed thereon by RIE. The substrate 41 was immersed in a diluted hydrogen fluoride before the treatment by the CDE apparatus. These procedures eliminated a naturally oxidized film on the inner wall surface of the trench 43. Consequently, as shown in FIG. 4b, the bottom and sidwalls of the trench 43 became smoothened. It became apparent that this treatment prevented the occurrence of roughness caused by the CDE treatment itself. In addition, the small roughness, which Was present in the bottom and sidewalls of the trench 43 immediately after the RIE, was also reduced. However, only in the vicinity of the opening of trench 43 close to the SiO₂ mask 42 was difficult to be etched, and remained.

These results are due to that the etching speed depending on the amount of fluorine radicals decreases significantly when the oxygen increases. Specifically, the oxygen was released from the SiO₂ mask 42, so that the etching speed was locally decreased. On the surface of trench 43 immediately after RIE, the naturally oxidized irregular film was present. The thicker portions of the film were not etched at all. To the contrary, the thinner portions of the film were significantly etched, so that the roughness of the film surface became significant.

Figure 5A:
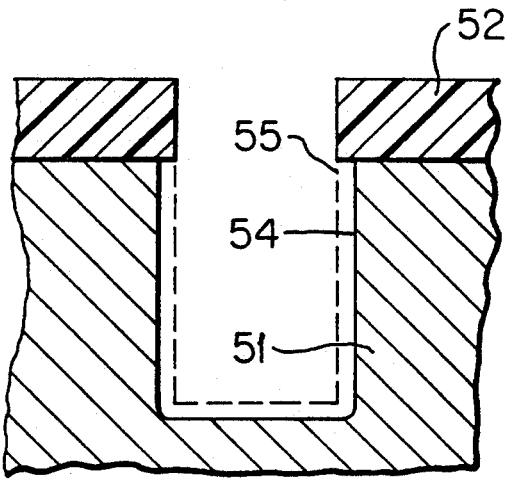
FIGS. 5a through 5d are cross-sectional views illustrating a substrate in the steps according to another embodiment of the present invention.
Figure 5B:
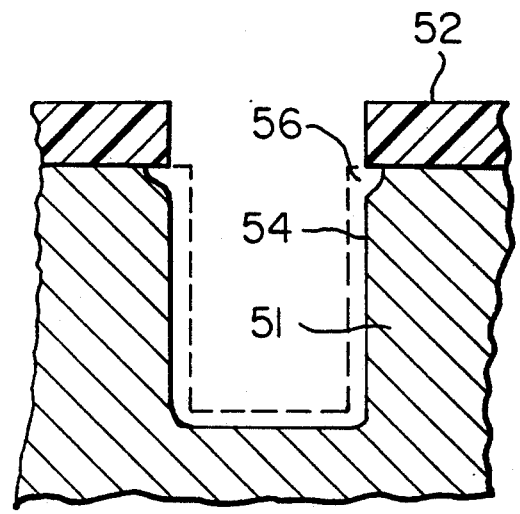
Figure 5C:
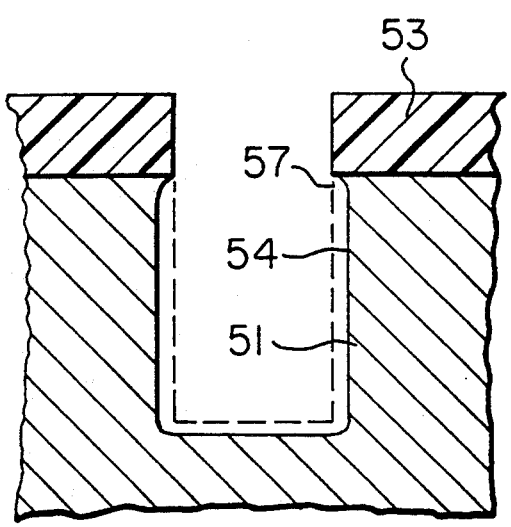
Figure 5D:
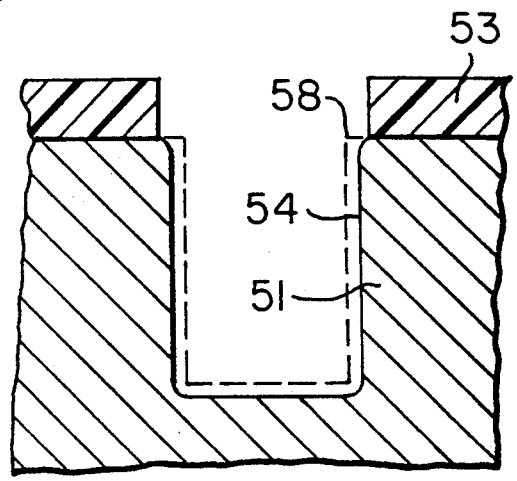

FIGS. 5a through 5d are cross-sectional diagrams respectively illustrating the etched shapes of silicon substrates 51 The etching mask of substrate 51 was made of different materials. Specifically, FIGS. 5a and 5b show the case where an etching mask 52 was made of organic photo-resist FIGS. 5c and 5d show the case where an etching mask 53 was made of SiO₂. In FIG. 5a, an opening portion 55 in contact with the mask 52 was etched without being rounded. In this case, the mask 52 in the periphery of the opening of trench 54 was not previously eliminated. Thus, in the treatment by the CDE apparatus of FIG. 1, the corners of bottom portions of the trench 54 were rounded. However, the opening portion 55 of trench 54 was not rounded.

In FIG. 5b, the mask 52 in the periphery of the opening of trench 54 was previously eliminated. Thus, in the treatment by the CDE apparatus of FIG. 1, a cavity 56 was formed at the opening portion immediately under the mask 52. Therefore, if the opening portion of trench 54 is required to be rounded, the mask 52 must be completely eliminated. In this case, all portions other than the trench 54 are inevitably etched. To the contrary, in the case of $SiO_2$ mask 53 as shown in FIG. 5c, the mask 53 in the periphery of the opening of trench 54 was not previously eliminated. Thereafter, the substrate 51 was treated by the CDE apparatus of FIG. 1. In this case, the opening portion 57 immediately under the mask 53 was difficult to be etched, and remained projected from the sidewalls of trench 54. In FIG. 5d, the mask 53 in the periphery of the Opening of trench 54 was previously eliminated. Thus, the upper corner portion 58 of trench 54 was rounded.

As described above, the etching mask made of materials containing oxygen, such as $SiO_2$ was formed on the silicon substrate. Then the mask in the periphery of the opening of trench was partially eliminated. Thereafter, the substrate with such partially eliminated mask was treated in the CDE apparatus using oxygen and fluorine. As a result, only the trench could be etched, and the corners of the upper and bottom portions of the trench could be rounded.

Figure 6A:
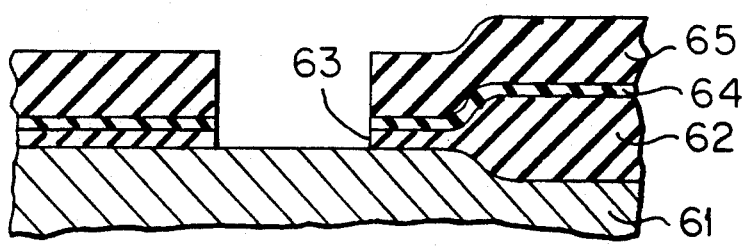
FIGS. 6a through 6g are cross-sectional views illustrating a substrate in the steps Of manufacturing a trench MOS capacitor according to another embodiment of the present invention.

A method of manufacturing a trench MOS capacitor according to another embodiment of the present invention will be described. FIGS. 6a through 6g are cross-sectional views for explaining the steps of manufacturing the trench MOS capacitor. In FIG. 6a, on a silicon wafer 61 having a bilateral (100) specific electric resistance of 10 Ωcm, a thick oxide film 62 was formed so as to achieve proper element isolation. Thereafter, an oxide film 63 of 1000 Å thick a silicon nitride film 64 of 1000 Å thick and an oxide film 65 of 5000 Å thick were deposited on the wafer 61 one after another so as to form etching masks for the silicon wafer 61.

Figure 6B:
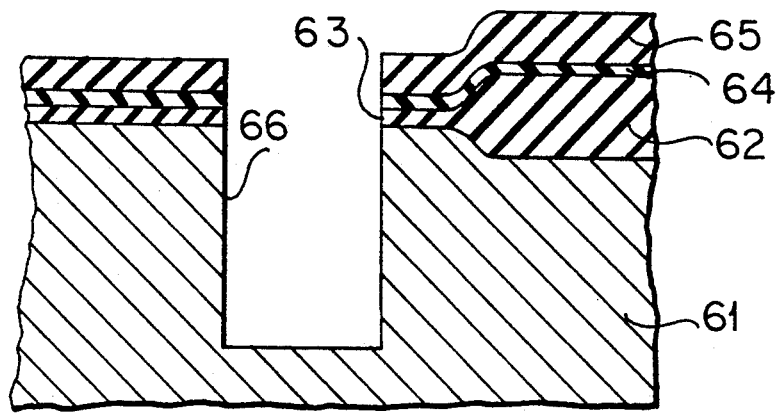

Next, as shown in FIG. 6b, a trench 66 of 3 μm deep for example was formed on the wafer 61 by RIE using a chlorine gas or the like as an etching gas. This trenching process was performed with these etching masks 63 through 65 in a self-alignment manner. Thereafter, the wafer 61 was treated using a buffer solution of hydrogen fluoride and ammonium fluoride so as to eliminate unnecessary portions.

Figure 6C:
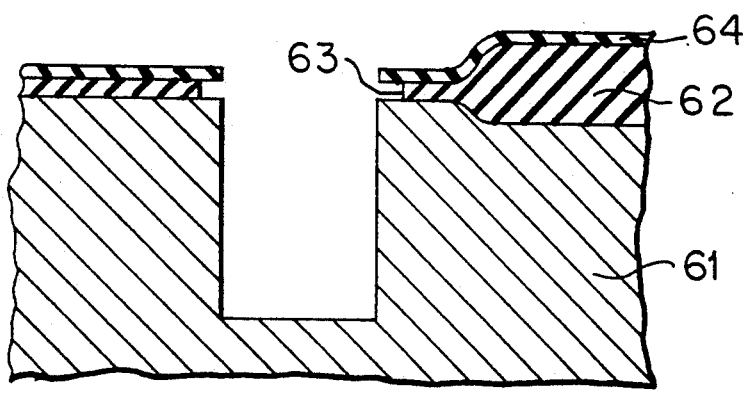

As a result, a naturally oxidized film on the inner wall of trench 66 and the upper layer mask 65 were eliminated. At the same time, the $SiO_2$ film 63 in the periphery of the opening of trench 66 was partially eliminated by a distance of about 1000 Å as shown in FIG. 6c.

Figure 6D:
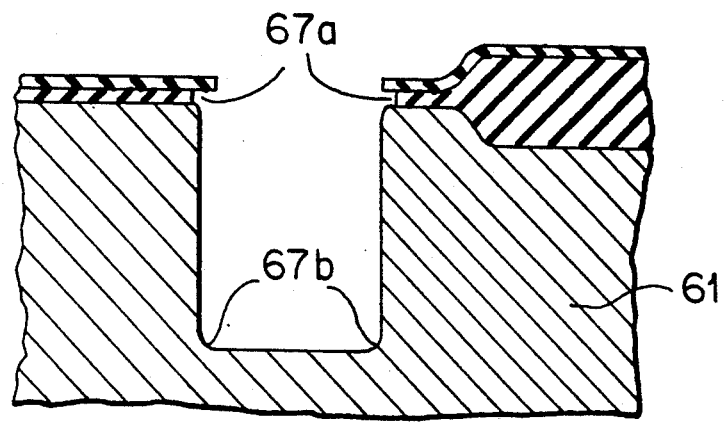
Figure 6E:
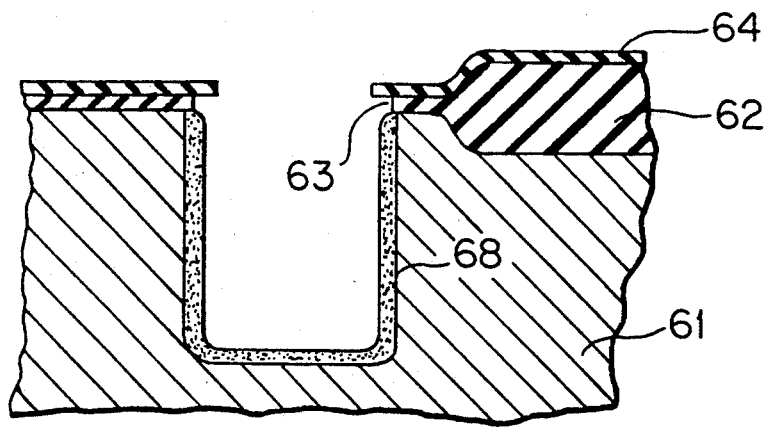

Next, the silicon wafer 61 was treated within the CDE apparatus of FIG. i under the following condition. Specifically, a $CF_4$ gas of 50 atm·cm/min and an $O_2$ gas of 150 atm·cm$^3$/min were introduced into the reaction container 11 of FIG. 1. Thereafter, a microwave of 400 W was applied to the electric discharge tube 14, and then the wafer 61 was treated for one minute. As a result, the upper and lower corners 67a and 67b of trench 66 were rounded as shown in FIG. 6d. Further, arsenic diffuses to the inner wall of trench 66, and thereon, an n-type diffusion layer 68 having a concentration of $5 \times 10^{20}$ cm$^{-3}$ and a depth of about 2000 Å was formed as shown in FIG. 6e.

Figure 6F:
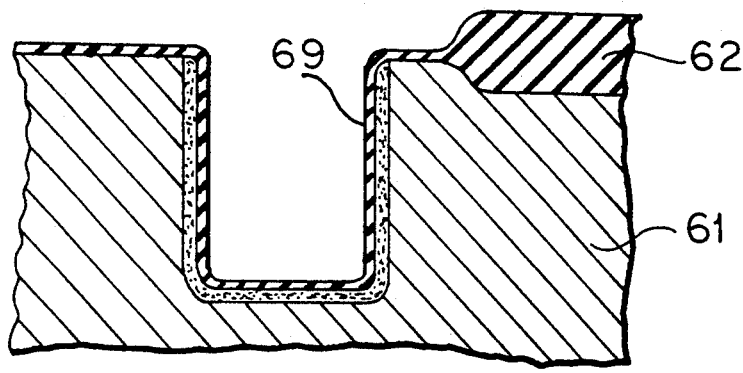
Figure 6G:
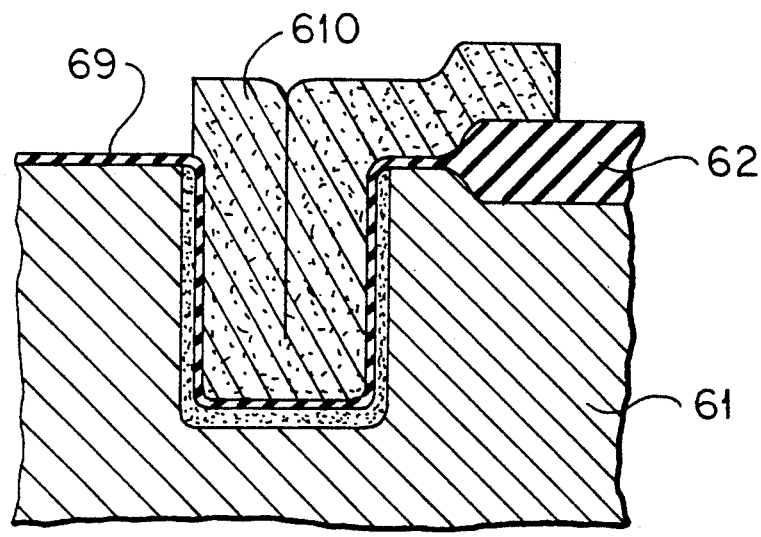

Next, the silicon nitride mask film 64 and the silicon oxide mask film 63 were eliminated. Thereafter, the surface of the n-type layer 68 on the inner wall of trench 66 was oxidized. Thus, an oxide film 69 of 150 Å thick was formed thereon as shown in FIG. 6f. Next, a phosphor-doped polycrystalline silicon 610 was deposited in the trench 66 with the n-type layer 68 formed as shown in FIG. 6g. The polycrystalline silicon 610 was formed as an electrode so as to constitute a trench MOS capacitor. The thus formed trench MOS capacitor is provided with the trench 66 in Which upper and lower corners have large radius of the curvature. Therefore, the thickness of the gate oxide film 69 is not thinner than the other portions. This can avoid problems in which a leakage current increases and the insulation effect of the oxide film 69 deteriorates. Thus, a highly reliable trench MOS capacitor can be assuredly formed. When semiconductor devices such as MOS-type DRAM are manufactured using the thus formed trench MOS capacitor, the characteristics and reliability of such semiconductor devices can be significantly enhanced.

For the sake of comparison, the inventors of this invention have measured the leakage currents of trench MOS capacitors of two kinds. One of the capacitors had the trench corner portions formed in the conventional manner, namely, they were not rounded. The other capacitor had the trench corner portions rounded in the manner as described above in this embodiment. Both the capacitors had a total area of 0.1 cm$^2$ and a trench circumference length of 50 mm. A voltage of 5 V was respectively applied across the sides of the insulating oxide film of each capacitors. As a result, a leakage current of $10^{-6}$ A flowed in the case of the capacitor having conventional angular corners in the trench. While in the case of the capacitor having trench corners rounded according to this embodiment, a leakage current of $10^{-9}$ A flowed.

Next, another embodiment wherein an element isolation region is formed according to the present invention will be described.

Figure 7A:
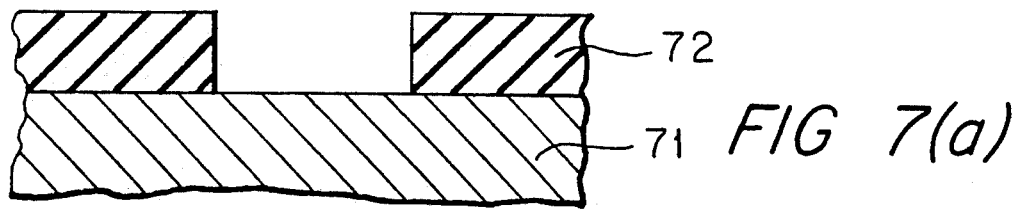
FIGS. 7a through 7g are cross-sectional views illustrating a substrate in the steps of manufacturing an element isolation region according to another embodiment of the present invention.
Figure 7B:
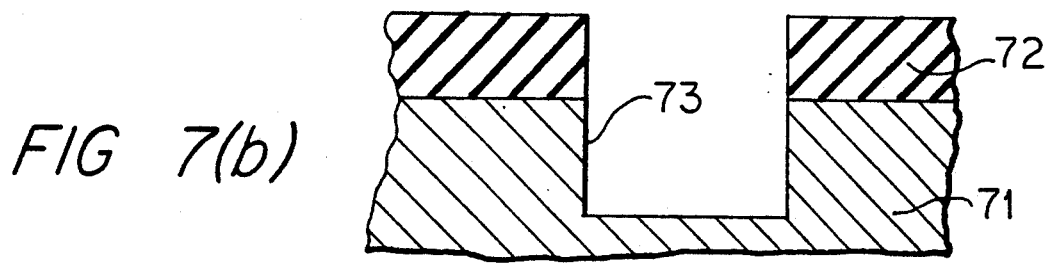
Figure 7C:
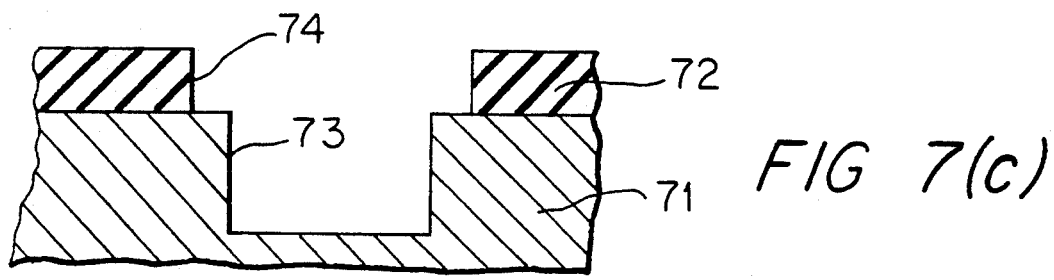
Figure 7D:
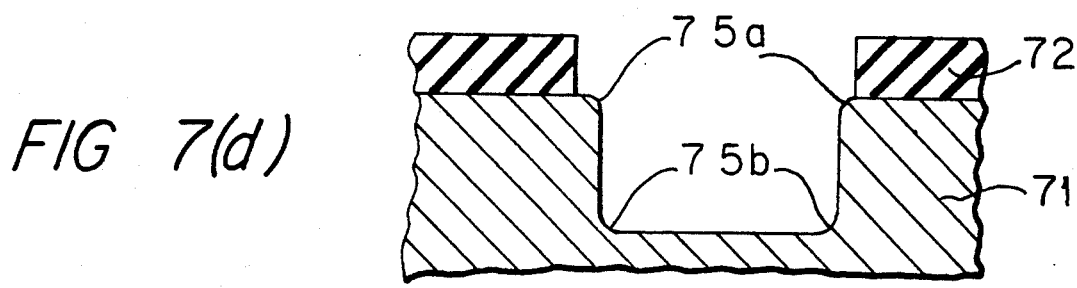

FIGS. 7a through 7g are cross-sectional views illustrating a substrate in the steps of this embodiment. In FIG. 7a, on a silicon wafer substrate 71 having a p-type specific resistance 10 Ωcm, a $SiO_2$ film was formed a p-type specific resistance 10 Ωcm, a $SiO_2$ film was formed as an etching mask. Next, on the wafer 71, a trench 73 of 1.0 mm wide and 0.5 μm deep was formed by RIE as shown in FIG. 7b. Next, the wafer 71 was immersed into a buffer solution of hydrogen fluoride and ammonium fluoride. As a result, the mask 72 in the periphery of the opening of trench 73 was partially eliminated. Thus, a portion 74 of the wafer 71 was exposed. Thereafter, the Wafer 71 was treated in the CDE apparatus of FIG. 1 for 1 minute and 30 seconds. This treatment was made under the condition in which $CF_4$ of a flow rate of 50 atm·cm$^3$/min and $O_2$ of a flow rate of 150 atm·cm$^3$/min were respectively introduced. As a result, the upper and lower corners 75a and 75b of trench 73 were rounded as shown in FIG. 7d. Next, B$^+$ions of a dose of $5 \times 10^{-13}$ cm$^{-2}$ were implanted by an accelerating voltage of 30 key into the inner wall of trench 73.

Figure 7E:
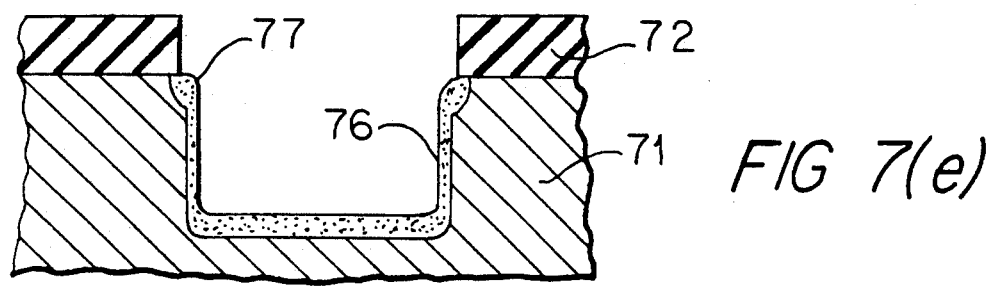
Figure 7F:
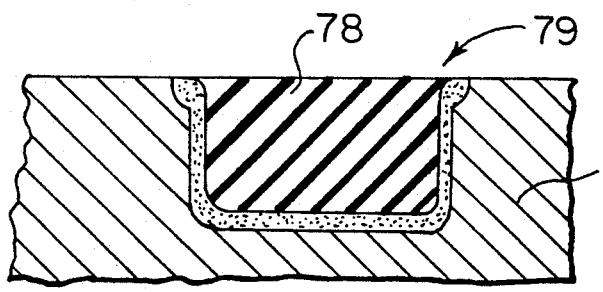
Figure 7G:
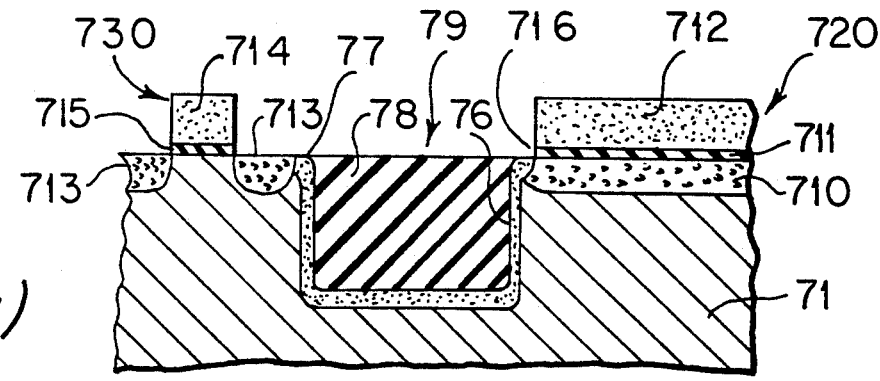

Thus, a p-type inverse-prevention layer 76 was formed on the inner wall of trench 73. Here, the B$^+$ions of a dose relatively larger than other portions within the trench 73 were implanted into the rounded portions 77. Thus, element isolation can be efficiently achieved as shown in FIG. 7e. Further, a $SiO_2$ film 78 was buried by CVD (chemical vapor deposition) and by etch-back process into the trench 73. Thus, an element isolation region 79 was formed as shown in FIG. 7f. thereafter, as shown in FIG. 7g, on one side of the thus formed element isolation region 79, an n layer 710 was formed. Further, on the layer 710, an oxide film 711 and a polycrystalline silicon electrode 712 were formed so as to constitute a MOS capacitor 720. On the other side of the element isolation region 79, an n layer 713 and a gate oxide film 715 were formed. Next, on the film 715, a polycrystalline silicon gate electrode 714 was formed. Moreover, on both sides of the film 715, n⁻ layers 713 were formed. These layers 713 serve as a source and drain of a MOS FET 730.

As described above, in this embodiment, the upper corner 77 of the element isolation region 79 was rounded. Thus, the B+ ions were efficiently implanted into this rounded corners. As a result, an inverse-leakage current toward the p-n junction region was significantly reduced. Moreover, the roughness of the corners 77 and the sidewalls of trench caused by RIE was suppressed so as to be smoothened. Therefore, the surface state density thereof was lowered. Thus, formation efficiency of minority carrier was lowered.

As can be seen from these results, when this embodiment is applied for manufacturing semiconductor devices such as DRAM, the holding characteristics of the trench MOS capacitor can be significantly enhanced.

Next, still another embodiment wherein a stacked capacitor element is formed will be described with reference to the drawings.

Figure 8A:
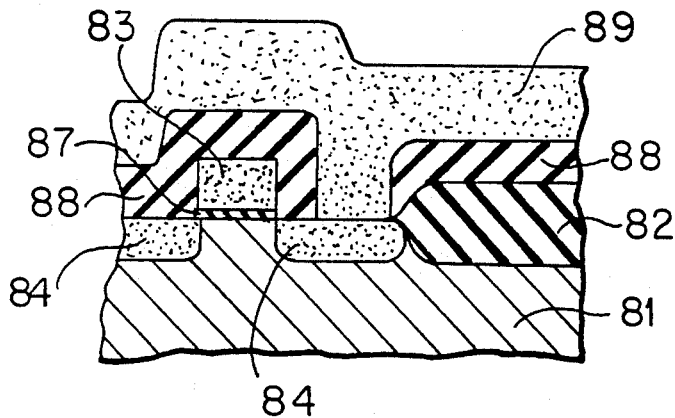

FIGS. 8a through 8d are cross-sectional views illustrating a substrate in the steps of this embodiment. In FIG. 8a, on a p-type silicon substrate 81, a thick oxide film 82 was formed for element isolation. On the other hand, a gate oxide film 87 was formed on the silicon substrate 81. Further, on the film 87, a gate silicon electrode 83 was formed. On both sides of this electrode 83, two n⁻ layers 84 were formed. These elements of 83, 84 and 87 constituted a MOS FET. Further, on the MOS FET, an insulating film 88 was extensively deposited. Thereafter, a contact hole was formed so as to connect between the n⁻ layer 84 and the film 88. For example, a phosphor-doped polycrystalline silicon thin film 89 was deposited on the n⁻ layer 84 and the insulating film 88.

Figure 8B:
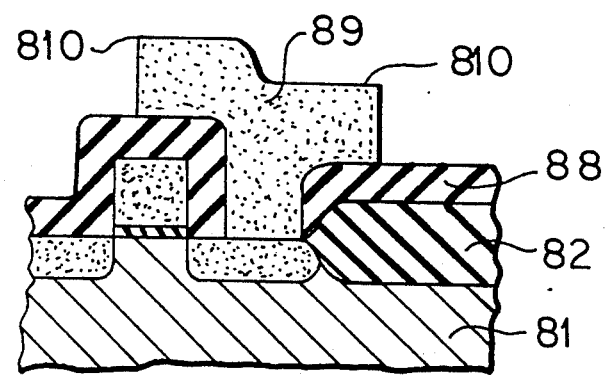

Next, in FIG. 8b, the film 89 was etched by RIE, thus, the etched portions developed angular corners 810. Moreover, although not shown, a large number of grain boundaries were present on the surface of the film 89, whereby unevenness appeared.

Next, the substrate 81 was treated using a 1/20-dilute solution of hydrogen fluoride for 20 seconds. Thus, a naturally oxidized film on the surface of the film 89 was eliminated. Thereafter, the substrate was treated in the CDE apparatus of FIG. 1 for 45 seconds under the same conditions as those in the above-described embodiments. Namely, the treatment was performed using the gas mixture such as CF₄ of 50 atm·cm³/min and O₂ of 120 atm·cm³/min. In this treatment, the film 89 was etched by about 500 Å thick. As a result, the angular corners 810 of the film 89 were rounded, and the surface thereof was also smoothened as shown in FIG. 8c. Further, the previously etched portions 811 being present immediately on the oxide film 88 were difficult to be etched. Thus, the side walls thereof became shaped in a taper fashion.

Moreover, as shown in FIG. 8d, the surface of the phosphor-doped polycrystalline silicon film 810 was oxidized. Thus, an oxide film 812 of 100 Å thick was formed. In addition, a phosphor-doped polycrystalline silicon electrode 813 was formed on the film 812.

As described above, a so-called stacked MOS capacitor was manufactured. The corner portions of this capacitor formed by etching were rounded, and the surface thereof were more smoothly finished as compared to the conventional capacitor being treated without rounding procedures. Therefore, the insulating effect of the oxide film of this capacitor was enhanced, and the leakage current of this capacitor was significantly reduced.

Next, another embodiment according to the present invention wherein multi-layer leads are formed will be described with reference to FIGS. 10a through 10c.

Figure 9C:
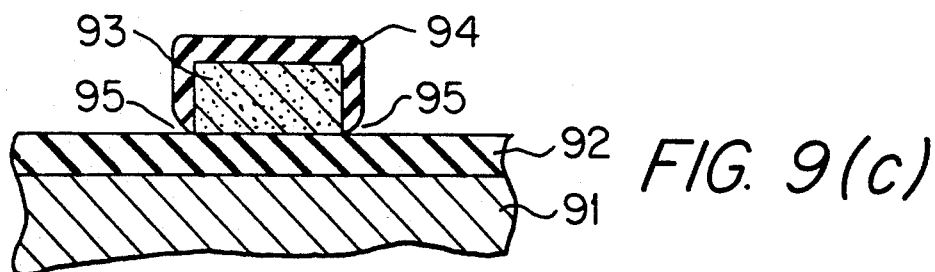

For the sake of comparison, the conventional steps of manufacturing multi-layer leads will be described with reference to FIGS. 9a through 9d. FIGS. 9a through 9d show the cross-sectional views of a substrate in the conventional steps. In FIG. 9a, an insulating film 92 of SiO₂ is deposited extensively on a semiconductor substrate Thereafter, a lead layer 93 of such materials as phosphor-doped polycrystalline silicon or molybdenum silicide or tungsten deposited on the insulating film 92.

Next, the lead layer 93 is processed by RIE into a required pattern as shown in FIG. 9b. Thereafter, an oxide film 94 is formed on the surface of lead layer 93 by thermal oxidation as shown in FIG. 9c.

Figure 9D:
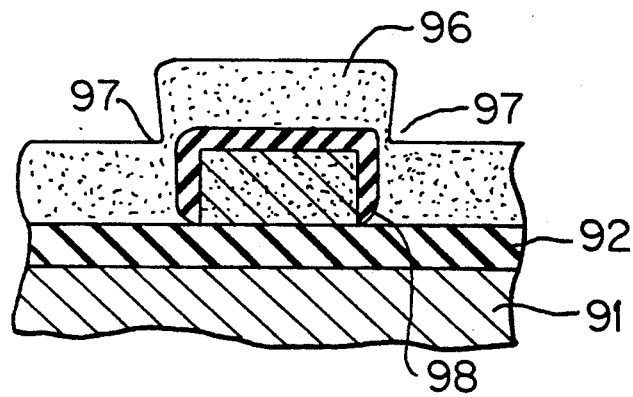

In this case, the oxide film of the lower corners 95 of lead layer 93 become thinner, so that they are scooped. Next, as shown in FIG. 9d, a second lead layer 96 is deposited so as to cover the lead layer 93 and Oxide film 94. As a result, portions 97 corresponding to the upper corners of the lead layer 93 become thinner. Thus, these portions 97 of second lead layer 96 are easily broken. Further, the portions 98 of second lead layer 96 enter the scooped portions 95. Thus, the portions 98 are difficult to be eliminated by RIE. These remaining portions 98 become a cause of leakage current.

Figure 10A:
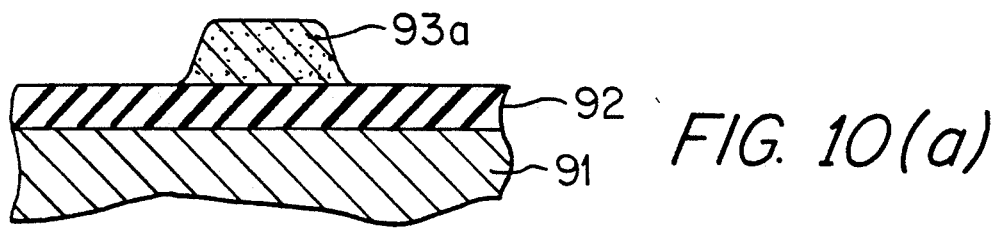
FIGS. 10a through 10c are cross-sectional views illustrating a substrate in the steps of manufacturing multi-layer leads according to another embodiment of the present invention.
Figure 10B:
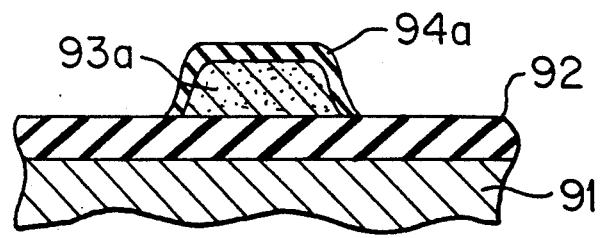
Figure 10C:
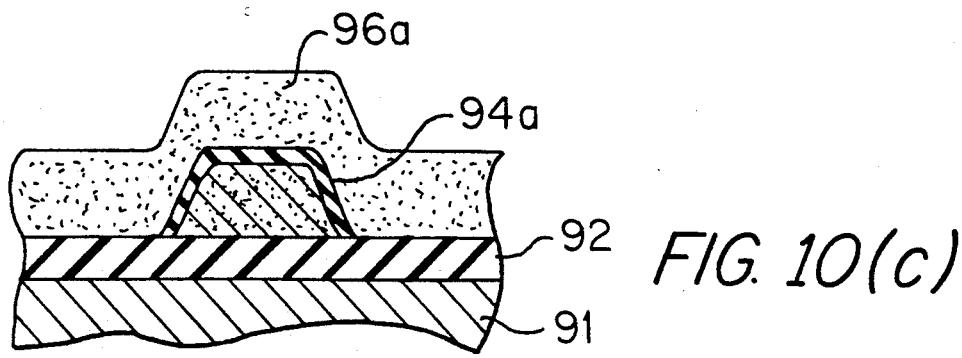

FIGS. 10a through 10c are cross-sectional view illustrating a substrate in the steps of forming multi-layer leads in this embodiment according to the present invention. First, on the substrate 91, an insulating film 92 and a lead layer 93a were formed in the same manner as in FIG. 9b. Thereafter, the substrate 91 was treated in the CDE apparatus of FIG. 1. The treatment was performed for 1 minute under the condition in which a gas mixture of CF₄ of 50 atm·cm³/min and O₂ of 120 atm·cm³/min was used for etching. In this treatment, the surface of lead layer 93a made of polycrystalline silicon of about 800 Å thick was etched out. Similarly to the previous embodiments, the interface between the film 92 and the lead layer 93a was practically not etched.

Further, the upper corner portions of lead layer 93a were rounded, and the side walls thereof became taper-shaped as shown in FIG. 10a. Next, on the lead layer 93a, an oxide film 94a was formed by oxidization. In this step, no scooped portion appeared on the interface between the films 92 and 93a as shown in FIG. 10b. In addition, a second lead layer 96a was deposited on the oxide film 94a. In this step, the thickness of portions of the second lead layer 96a corresponding to the upper corners of the lead layer 93a was not reduced as shown in FIG. 10c.

As described above, according to the method in this embodiment, when multi-layer leads are formed on the substrate, the breaking of leads or the short-circuits therebetween are difficult to occur. Thus, the reliability of semiconductor devices can be significantly enhanced.

Moreover, in this embodiment, a lead layer of polycrystalline silicon was described as an example to be rounded. However, other materials such as molybdenum and tungsten that react with fluorine so as to produce volatile compounds, or any metal silicide may be utilized as lead layer materials. The experiments made by the inventors of this invention have confirmed that lead layers and trench of these materials could be rounded at the corner portions thereof. The rounding processes were performed in the CDE apparatus using oxygen having an abundance ratio of one or more with respect to fluorine.

Obviously, numerous additional modifications and variations of the present invention are possible in light of the above teachings. It is therefore to be understood that within the scope of the appended claims, the invention may be practiced otherwise than as specifically described herein.

What is claimed is:

1. A method of manufacturing a semiconductor device comprising the steps of:
   anisotropically etching a surface of a silicon substrate to produce a shape therein having angular corner portions; and
   rounding the corner portions by chemically dry etching the corner portions of the substrate while forming a fill of silicon oxy-fluoride on the surface of the silicon substrate with a gas mixture including oxygen and fluorine, with atoms of the oxygen having a content ratio of greater than one with respect to atoms of the fluorine.

2. The method of claim 1 also including the step of doping an impurity having either an n-type or a p-type conductivity into the silicon substrate prior to the anisotropically etching the surface of the substrate.

3. The method of claim 1, also including the step of forming a lead having step portions of the substrate.

4. The method of claim 3, wherein the step of forming the lead includes anisotropic etching a thin polycrystalline silicon film formed on the substrate.

5. The method of claim 4, further comprising the step of chemical dry etching step portions of the lead with a gas mixture including oxygen and fluorine, with atoms of the oxygen having a content ratio of 1.2 or more with respect to atoms of the fluorine for rounding the angular corner portions of the lead.

6. The method of claim 5 further comprising the step of eliminating a naturally oxididzed film on the lead between the step of forming the lead and the step of chemically dry etching the step portions of the lead.

7. The method of claim 6, also including the step of doping an impurity of either an n-type or a p-type conductivity into the lead prior to anisotropically etching the surface of the substrate.

8. The method of claim 3, further comprising the step of covering the lead with an insulating film and forming a second lead on the insulating film.

9. The method of claim 3, wherein said lead is formed of a material selected from the group consisting of metal, metal silicide and polycrystalline silicon.

10. The method of claim 3, further comprising the step of eliminating a naturally oxidized film formed on the lead between said step of forming the lead and said step of etching the step portions of the lead.

11. The method of claim 10 also including the step of doping an impurity having either an n-type or a p-type conductivity into the lead prior to anisotropically etching the surface of the substrate.

12. The method of claim 3 also including the step of doping an impurity having either an n-type or a p-type conductivity into the lead prior to anisotropic etching to form the trench.

13. The method of claim 1, wherein said chemically dry-etching is performed by providing electric discharge of a gas for reaction with the corner portions of the substrate at a location spaced apart from a location of the silicon substrate.

14. A method of manufacturing a semiconductor device comprising the steps of:
   forming a trench having angular corners and a surface portion on a silicon substrate by anisotropic etching;
   rounding the corners by chemically dry etching the corners of the trench formed on the substrate while forming a film of silicon oxy-fluoride on the surface of the substrate with a gas mixture including at least fluorine and oxygen, with atoms of the oxygen having a content ratio of greater than one with respect to atoms of the fluorine;
   forming an insulating film on the surface portion of the trench; and
   forming an electrode at least partially in the trench and on the insulating film.

15. The method of claim 14, further comprising the step of eliminating a naturally oxidized film formed on an inner wall of the trench between said forming the trench and a etching the angular corners of the trench.

16. The method of claim 15, wherein said step of eliminating said naturally oxidized film is effected by contact with hydrogen fluoride.

17. The method of claim 14 also including the step of doping an impurity having either an n-type or a p-type conductivity into the silicon substrate prior to said forming the trench.

18. The method of claim 14, further comprising the step of masking the substrate except a portion thereof where the trench is to be formed with an etching mask prior to forming the trench.

19. The method of claim 18, further comprising chemically eliminating the etching mask covering the angular corners of the trench prior to said step of dry etching the angular corners of the trench.

20. The method of claim 19, wherein the step of masking includes the step of depositing a mask of a material including oxygen.

21. The method of claim 14, wherein an interior surface including sidewalls of the trench are smoothened by the chemically dry etching.

22. A method of manufacturing a semiconductor device, comprising the steps of:
   forming a trench on a silicon substrate by anisotropic etching;
   chemically dry etching angular corner portions of the trench formed on the substrate with a gas mixture including at least fluorine and oxygen while forming a film of silicon oxy-fluoride on the surface of the substrate, with atoms of the oxygen having a content ratio of greater than one with respect to to atoms of the fluorine for rounding the angular corner portions; and
   burying an insulating film in the trench for forming an element isolation region.

23. The method of claim 22, further comprising the step of eliminating a naturally oxidized film formed on the inner wall of the trench between said forming the trench and said etching the corner portions of the trench.

24. The method of claim 22, further comprising the step of masking the substrate except for a portion thereof where the trench is to be formed with an etching mask prior to forming the trench, and a step of eliminating the etching mask covering the angular corner portions of the trench after said step of forming the trench and prior to said as step of chemically dry etching the angular corner portions of the trench.

25. The method of claim 24, wherein the step of masking includes the step of depositing a mask of a material including oxygen.

26. The method of claim 22 also including the step of doping an impurity having either an n-type or a p-type conductivity into the silicon substrate prior to the anisotropic etching to produce the shape of the surface of the silicon substrate.

* * * * *